United States Patent
Quick et al.

(10) Patent No.: US 8,724,614 B2
(45) Date of Patent: May 13, 2014

(54) RADIO NETWORK COMMUNICATION SYSTEM AND PROTOCOL

(75) Inventors: Ashleigh Glen Quick, Bowden (AU); Donald Murray Terrace, Bowden (AU)

(73) Assignee: Clipsal Integrated Systems Pty Ltd, South Australia (AU)

( * ) Notice: Subject to any disclaimer, the term of this patent is extended or adjusted under 35 U.S.C. 154(b) by 519 days.

(21) Appl. No.: 12/578,167

(22) Filed: Oct. 13, 2009

(65) Prior Publication Data

US 2010/0034188 A1 Feb. 11, 2010

Related U.S. Application Data

(62) Division of application No. 10/567,575, filed as application No. PCT/AU2004/001053 on Aug. 9, 2004, now Pat. No. 8,000,307.

(30) Foreign Application Priority Data

Aug. 8, 2003 (AU) ............................ 2003904170

(51) Int. Cl.
| | |
|---|---|
| *H04J 3/24* | (2006.01) |
| *H04N 21/2368* | (2011.01) |
| *H04N 7/64* | (2006.01) |
| *H03M 5/12* | (2006.01) |
| *H04W 80/04* | (2009.01) |
| *H04N 7/52* | (2011.01) |

(52) U.S. Cl.
CPC ............ *H04N 21/2368* (2013.01); *H04W 80/04* (2013.01); *H04N 7/52* (2013.01); *H04N 7/64* (2013.01); *H03M 5/12* (2013.01)
USPC ............ 370/349; 370/336; 370/337; 375/361

(58) Field of Classification Search
None
See application file for complete search history.

(56) References Cited

U.S. PATENT DOCUMENTS

| | | | |
|---|---|---|---|
| 5,040,175 | A | 8/1991 | Tuch et al. |
| 5,307,349 | A | 4/1994 | Shloss et al. |

(Continued)

FOREIGN PATENT DOCUMENTS

| | | |
|---|---|---|
| CN | 1184390 | 6/1998 |
| JP | 3-154455 | 7/1991 |

(Continued)

OTHER PUBLICATIONS

Adrian Mills, "Manchester encoding using RS232 for Microchip PIC RF applications", Jan. 9, 2002, www.quickbuilder.co.uk, Rev 1.1.*

(Continued)

*Primary Examiner* — Ian N Moore
*Assistant Examiner* — Jackie Zuniga Abad
(74) *Attorney, Agent, or Firm* — Greenblum & Bernstein, P.L.C.

(57) ABSTRACT

A communications system and protocol for a radio communications network including a number of transceiver devices. The protocol ensures that network variables to be shared by all devices are correctly received and updated by all devices. The protocol also provides for accurately detecting the transition from one time slot to another, in a given data transaction. The protocol utilizes a method of providing a marker in a data time frame for use such as marking the end of a variable slot in a data frame. The method includes encoding data into states, and then generating a marker that is an illegal combination of states in the encoding scheme.

4 Claims, 2 Drawing Sheets

(56) References Cited

U.S. PATENT DOCUMENTS

| | | | |
|---|---|---|---|
| 5,570,355 A | 10/1996 | Dail et al. | |
| 5,923,662 A | 7/1999 | Stirling et al. | |
| 6,026,082 A | 2/2000 | Astrin | |
| 6,064,705 A * | 5/2000 | Zalud et al. | 375/361 |
| 6,233,251 B1 * | 5/2001 | Kurobe et al. | 370/471 |
| 6,343,331 B1 | 1/2002 | Stirling | |
| 6,493,335 B1 | 12/2002 | Darcie et al. | |
| 6,574,668 B1 | 6/2003 | Gubbi et al. | |
| 6,751,682 B1 | 6/2004 | Stirling | |
| 6,804,533 B1 | 10/2004 | Makinen | |
| 6,865,188 B1 | 3/2005 | Stirling et al. | |
| 2001/0055312 A1 | 12/2001 | Negus | |
| 2002/0101839 A1 | 8/2002 | Farley et al. | |
| 2002/0105961 A1 | 8/2002 | Hottinen et al. | |
| 2003/0227934 A1 | 12/2003 | White et al. | |
| 2004/0025018 A1 | 2/2004 | Haas et al. | |
| 2004/0081124 A1 | 4/2004 | Black et al. | |
| 2006/0192697 A1 | 8/2006 | Quick et al. | |
| 2006/0256746 A1 | 11/2006 | Quick et al. | |

FOREIGN PATENT DOCUMENTS

| | | |
|---|---|---|
| JP | 8-51413 | 2/1996 |
| JP | 9-107373 | 4/1997 |
| JP | 2001-231078 | 8/2001 |
| JP | 2001-511971 | 8/2001 |
| JP | 2001-515309 | 9/2001 |
| JP | 2001-515312 | 9/2001 |
| JP | 2003-526223 | 9/2003 |
| WO | 98/36533 | 8/1998 |
| WO | 99/12313 | 3/1999 |
| WO | 99/12319 | 3/1999 |
| WO | 99/14891 | 3/1999 |
| WO | 01/78426 | 10/2001 |
| WO | 03/105353 | 12/2003 |
| WO | 2004/034310 | 4/2004 |

OTHER PUBLICATIONS

English Language Abstract of JP 2001-231078, Aug. 24, 2001.
Hui Zhao, Toru Sato, Iwane Kimura; New Go-Back-N ARQ Protocols for Point-to-Multipoint Communications, Aug. 1994, pp. 1013-1015.

* cited by examiner

RADIO NETWORK COMMUNICATION SYSTEM AND PROTOCOL

CROSS-REFERENCE TO RELATED APPLICATIONS

The present application is a divisional of co-pending U.S. application Ser. No. 10/567,575, filed Feb. 8, 2006, which is a National Stage of International Application PCT/AU04/001053, filed on Aug. 9, 2004, which claims the priority benefit of Australian Application No. 2003904170, filed Aug. 8, 2003, the subject matter of which are expressly incorporated herein by reference in their entireties.

TECHNICAL FIELD

This invention relates to a network of devices which communicate with each other via radio frequency.

BACKGROUND OF THE INVENTION

A network of devices can be created by arranging a group of devices which can communicate with each other via radio frequency (RF) means to transmit data between the devices. Provided that each of the devices is within the range of the maximum communications range of each device, each device can effectively communicate with each other device in the network.

In many such networks, the devices may all be transceivers, ie are each capable of both transmitting and receiving. For the purpose of transferring an item of data, one device acts predominantly as a transmitter while other devices act predominantly as receivers.

The present invention is to be used in a "point to multipoint" system as opposed to a "point to point" system in which communications occur between only two devices at a time. In a point to multipoint communication system, communications occur between one device and two or more of the other devices in the network simultaneously.

A reliable "point to multipoint" communication system allows the creation of a shared network variable. This is a variable which is known to all of the devices in the network. For example, if one device wants to change the value of the shared network variable, it must transmit a request and be guaranteed that all devices receive and process the updated variable simultaneously. If the update cannot be made simultaneously, or not all other devices in the network receive the update, then the network does not have a shared network variable.

Shared network variables allow the creation of a network which has no central controller. All of the essential data about the operation and control of the network is known by each device in the network simultaneously. The data can be updated by any device in the network at any time and all other devices are guaranteed to update their data accordingly. This allows the control of devices within the network to be simplified, more flexible, and less costly when compared with networks having a central controller.

A single communication action between each of the devices is herein referred to as a Transaction. A Transaction occurs between a device (transceiver/transmitter) which transmits data to one or more transceiver/receivers of the data. The Transaction also includes data sent from the transceiver/receivers to the transceiver/transmitter as well as to each other of the transceiver/receiver devices in the network. In this context, a device which for a given Transaction, transmits the data to be shared throughout the network is referred to as a "transceiver/transmitter" while a device which receives that data within the Transaction, is returned to as a transceiver/receiver. It will be understood that within the same Transaction, a given transceiver/receiver may also transmit an acknowledge signal. In the next Transaction, the transceiver/receiver may become the transceiver/transmitter. When transmitting to more than one transceiver/receiver simultaneously (also known as a broadcast or multicast), it is important to know that all transceiver/receivers have successfully received the data. If even one transceiver/receiver has not successfully received the data (for example because of a bit error causing data corruption in one transceiver/receiver), then all other transceiver/receivers must be informed that not all of the other transceiver/receivers have successfully received the data.

Such networks can also optionally use a transmission system with dominant and inferior bits. This means that if there is a conflict, and two devices simultaneously transmit a dominant and inferior bit, then when monitoring the communication medium, each device will see the transmission of the dominant bit. The device transmitting the inferior bit knows that there has been a conflict and can take whatever action is appropriate. For example, this may mean the cessation of all further transmissions.

In conventional point to point communication protocols, a general procedure is to have each device transmit an acknowledge statement some time after receipt of the data. This has the drawback that the transmitting device must know exactly the number of receiving devices within the network, and how to contact each of them. The reliable transfer of the same piece of data to multiple receiving devices requires many transmissions of the same data, and a corresponding wait for each transmission to be acknowledged. The repetitive transmission of the same data to many recipients wastes the available bandwidth of the communication medium. This approach also requires the transmitter to obtain and store data about exactly which receiving devices are to accept a given transmission. This approach allows the creation of a shared network variable, at the expense of unnecessary complexity and poor use of the available bandwidth of the communication medium.

Alternatively a point to multipoint transmission can be used to transfer data to many recipients simultaneously, without any acknowledgment being returned. This renders the data transfer unreliable, and the transmitter will not be able to determine whether all of the receiving devices have successfully received the data. Unreliable transfer of data means that a shared network variable cannot be created.

In such systems it is also necessary to be able to accurately determine a time or point in a data transmission where the type of data changes (for example a change from a control data transmission timeslot to an acknowledge timeslot).

Many well-known communication protocols are asynchronous and character based. The best example is the widely used serial RS/EIA-232 port.

Such protocols can be used, with difficulty, to transmit varying and fixed time portions. However, it is important that the asynchronous interface component (referred to as a Universal Asynchronous Receiver Transmitter, or UART) have well characterised timing and delay characteristics, and that those characteristics remain invariant. For example, any variation (for whatever reason) to the inter-character gap time would be catastrophic, because it would mean that different devices would fix different times for the same critical point. There would not be a common time reference for the start of the fixed time slots.

Character based protocols should be able to carry any information item that fits into the designated character size.

This conflicts with the need to have some means of signalling important points in the transmission, especially the end of the variable portion. This conflict arises because in the character based protocol, some of the characters need to take on a special meaning in order to signal the important point. This means that the special character cannot be used for data. The combined disadvantages of the asynchronous character-based protocol make it very difficult to use when a fixed time relationship is to be maintained between a variable and fixed time portion.

An alternative is to consider the protocol as a stream of bits, organised into characters by grouping (in other words, overlaying the character structure back over the bit stream). Each character can be inspected to see if it is significant or not. When a data item is to be transmitted which looks the same as a significant character, extra bits can be inserted to change it. The receiving device recognises the patterns of extra bits, and removes them, restoring the original character. By performing the recognition of the special characters at the correct point in the decoding path, both data and special characters can be separated. This is known as a bit-stuffing, and is widely used in protocols like HDLC. Bit-stuffing however, can be complicated and processing intensive.

In providing a system and protocol for improving the communications between devices in an RF point to multipoint communications system there is a need to provide markers in data time frames.

SUMMARY OF THE INVENTION

According to a first aspect of the present invention, there is provided a method of providing a marker within a data time frame having at least one variable time slot followed by a fixed time slot, the method including:
encoding data bits within a data sequence to provide states;
generating a state combination that is an illegal combination at the end of the variable time slot; and
recognising that illegal combination as a marker indicating the end of the variable time slot and the start of the fixed time slot.

The method of the present invention which has use in applications such as controlling domestic, industrial and office appliances.

DETAILED DESCRIPTION OF THE PREFERRED EMBODIMENT

Figure 1:
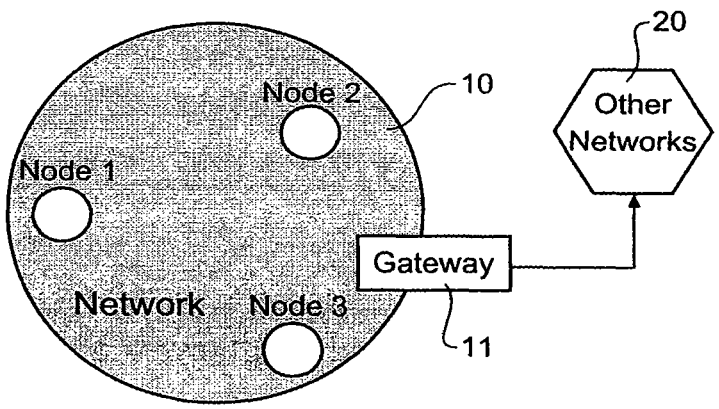
FIG. 1 shows one network architecture according to a preferred embodiment of the present invention.

An exemplary architecture of a network is shown in FIG. 1, in which the network 10 is made up of nodes 1, 2 and 3. Nodes 1, 2 and 3 are transceiving devices and may act as transmitters and/or receivers in a given communication Transaction. The network 10 may communicate with other networks 20, via gateway 11.

The protocol design of the present invention is based on the ISO seven layer model and some terminology is common with that used by ISO. The protocol used in the present invention is connectionless, meaning that once a single data transfer has taken place, there is no expectation of additional related data transfers either before or after.

Figure 2:
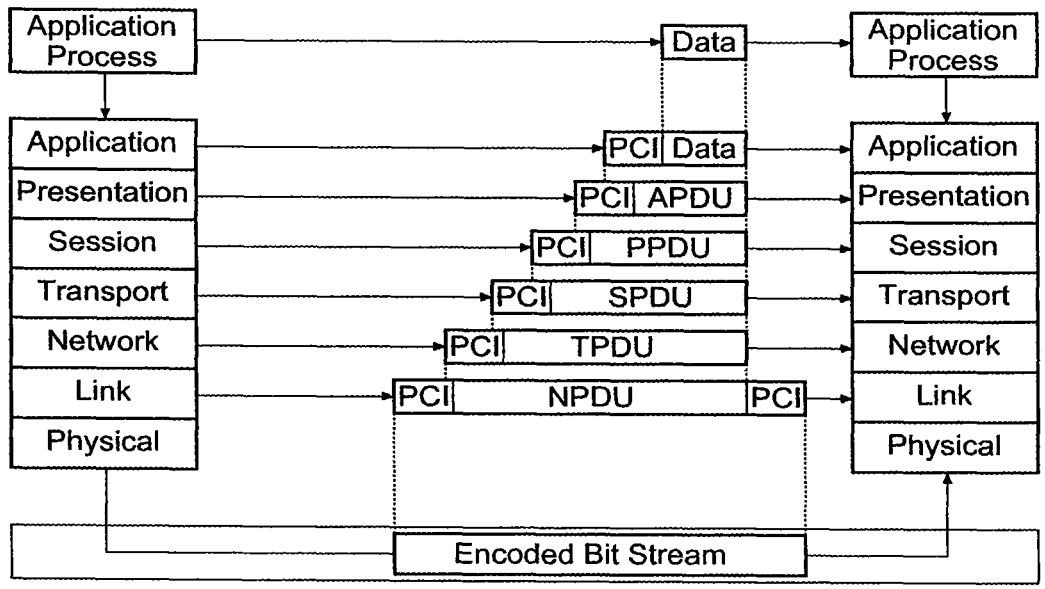
FIG. 2 shows the network protocol model used in the environment of the present invention.

The protocol model of the preferred embodiment is based on the ISO seven layer model and is shown in FIG. 2. For applications distributed over two nodes, each protocol layer has a virtual connection to the equivalent layer in the other node. As can be seen, each layer takes data provided by the layer above, treats it as a data unit and adds its own protocol control information (PCI) field. At each layer, the protocol data unit (PDU) is either the data, or a package provided by the next higher layer. The name of the PDU is prefixed by the layer to which it applies (For example, SPDU is a session PDU).

The physical layer relates to the mechanical and electrical network interface in the ISO system. In the system of the present invention, the physical layer refers to the hardware and firmware elements used to transmit and receive bits over the communication medium.

In the ISO system, the link layer is used for data link control (for example, framing, data transparency, error control). In the present invention, the link layer is used to break bytes up into bits, bit stuffing (if required), framing, collision detection, prioritisation, error detection, positive/negative acknowledge generation, checking and retransmission.

The network layer in the ISO system is used for networking routing, addressing, call set-up and clearing while in the present invention, the network layer is used for network routing, addressing, Transaction set-up and clear.

In the ISO system, the transport layer is used for end to end message transfer, connection management, error control, fragmentation and flow control. The transport layer is not used in the environment of the present invention.

The session layer in the ISO system is used for dialogue and synchronisation control for application entities but is not used in the environment of the present invention.

The presentation layer is used for transfer syntax negotiation, and data representation transformations in the ISO system while in the environment of the present invention, the presentation layer is used for optional encryption of application data.

The application layer in the ISO system is used for file transfer, access management, document and message interchange, job transfer and manipulation while in the environment of the present invention, the application layer supports sending and receiving application data.

Finally, the user application layer is used both in the ISO and the environment of the present invention for whatever is needed to achieve a specified function or behaviour.

It is predominantly in the link layer that the features of the present invention reside.

In the protocol of the present invention, use can optionally be made of a dominant bit, and an inferior bit. If two devices simultaneously transmit a dominant and an inferior bit, then receivers and transmitters (monitoring their own transmissions) will detect only the dominant bit.

Media access is obtained by a transmitter first monitoring the media, and if no existing transmission is detected, the transmitter will try to claim media access by transmitting a preamble stream. This preamble starts with at least one detectable bit. The claim for media access defines the start of a Transaction. A Transaction consists of all data transfer, acknowledgement and repeating of data. All nodes in a network must monitor the media continually and if they detect a Transaction occurring they will defer any attempt to claim media access until the completion of the current Transaction.

Transactions are asynchronous, that is, they can occur at any time and the time difference from the start of one Transaction to the next does not have to be an integral number of bit periods.

Figure 3:
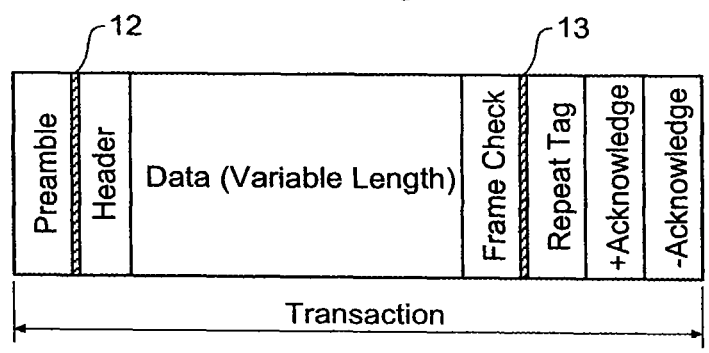
FIG. 3 shows a frame structure according to a preferred embodiment of the present invention.

In this application, a Transaction is specifically defined as a continuous period of time broken up into several sub-time slots containing different types of data. A Transaction will begin with a preamble for a set period of time, followed by the specific data which is to be transmitted from a transceiver/transmitter to two or more transceiver/receivers. The timeslot during which the data is transmitted is variable in length, and includes a portion used as a frame check sequence. Following the data transmission is a repeat timeslot tag (details of which will not be described as they are not relevant to the present invention) followed by a timeslot during which positive acknowledgement can be transmitted by the transceiver/receivers, followed by a timeslot during which negative acknowledgement is transmitted by the transceiver/receivers. The structure of this frame is shown in FIG. 3.

As described above, a Transaction is asynchronous and can start at any time. However, once started, the Transaction has a time-based structure. Special markers in the Transaction are used to show the beginning and end of the data portion. This will be discussed in more detail later. The time slots during which positive and negative acknowledgement are transmitted, are fixed in time. By coding and redundancy of data encoded into these timeslots, a positive acknowledgement by one or more transceiver/receivers and a negative acknowledgement by one or more transceiver/receivers can be conveyed. All of the devices involved in the Transaction see both of the acknowledgment timeslots.

Once data transmitted by the transceiver/transmitter (for example node 1 in FIG. 1) is received successfully by the transceiver/receivers (nodes 2 and 3), nodes 2 and 3 will acknowledge successful receipt.

If data from a Transaction is received with error by a transceiver/receiver, then that transceiver/receiver will transmit a negative acknowledge.

Transceiver/receivers wishing to positively acknowledge, will transmit a special code during the positive acknowledge timeslot and during the negative acknowledge timeslot will either receive (if dominant bit transmission is not used) or transmit inferior bits (if dominant/inferior bits are used).

Similarly, transceiver/receivers wishing to negatively acknowledge will either transmit inferior bits (if dominant/inferior bits are used) or receive (if dominant bit transmission is not used) during the positive acknowledge timeslot and transmit a special code during the negative acknowledge timeslot.

The fact that the devices monitor the timeslots during which they are not transmitting, ensures that by the end of two timeslots each device has detected either positive acknowledges, negative acknowledges or both and can therefore determine the overall acknowledge state of the network.

For example, the transceiver/receiver which transmits a positive acknowledge will be able to detect some other transceiver/receiver which transmits a negative acknowledge. For the case where dominant bits are used, this is because the transceiver/receiver positive acknowledging will attempt to transmit inferior bits during the negative acknowledge timeslot but will detect dominant bits due to the other transceiver/receiver which is simultaneously transmitting an appropriate code during the negative acknowledge timeslot. For the case where dominant bits are not used, the transceiver/receiver positive acknowledging will receive during the negative acknowledge timeslot and detect any bits due to the other transceiver/receiver which is transmitting an appropriate code during the negative acknowledge timeslot. The reverse case applies for the transceiver/receiver transmitting a negative acknowledge.

At the end of the Transaction, all devices do not know how many positive or negative acknowledges there were, all they have to know is that there were some positive and some negative.

If there were any negative acknowledges at all during the Transaction, then all of the transceiver/receivers know this, and can discard the data received. Similarly, the transceiver/transmitter knows this and can attempt to re-run the Transaction.

The generation of a positive acknowledge will be as follows. Upon receiving data, a node will generate a positive acknowledge only when:
 the data timeslot has been checked against its embedded frame check sequence and found to be valid; and
 any addressing information present in the data timeslot matches an addressing information used by the device.

Each device transceiver generally contains at least two different types of address, as follows:
 A Unit Address, allowing the device to be uniquely addressed in isolation; and
 A Multicast address, allowing those devices in a network to be addressed simultaneously for the purpose of updating shared network variables.

In addition, devices can also optionally contain:
 A Network Address, allowing physical devices to be grouped by the logical network to which they are allocated.

Other variations are possible, but these three address types are used as the basis for other more sophisticated addressing schemes.

Use of the positive acknowledge is useful as it provides an additional certainty to the functioning of the network. If for example, the transceiver/transmitter does not receive a positive acknowledge, from any device, and then does not receive a negative acknowledge from any device, there is no certainty that any device received the transmission.

It will be appreciated however, that the positive acknowledge is not essential to the broadest aspect of the present invention. Furthermore, the positive acknowledge could appear after the negative acknowledge.

The processes involved in generation of a negative acknowledge are as follows. A receiving device (transceiver/receiver) will generate a negative acknowledge only if the data timeslot is determined to be corrupted, by checking the received data using the embedded frame check sequence.

Where a device determines data timeslot corruption, there is no point further examining any fields inside the data timeslot.

Acceptance of the data transmitted by the transceiver/transmitter is only made by the transceiver/receivers if the condition for generation of a positive acknowledge are met and if no other transceiver/receiver has generated a negative acknowledge. This ensures that all transceiver/receivers receive a given message only once. For point-multipoint messages, this may mean that a message is discarded by a transceiver/receiver, even if it appears valid and was positively acknowledged.

In practice, it is beneficial to construct all devices in the network in the same way. This means that each device (generally referred to as a "transceiver"), whether it acts as a transceiver/transmitter or transceiver/receiver, will be constructed in the same way and can be separately enabled to perform the desired function. This provides significant savings in the complexity and cost of manufacture since only one type of device need be designed and manufactured.

Figure 4:
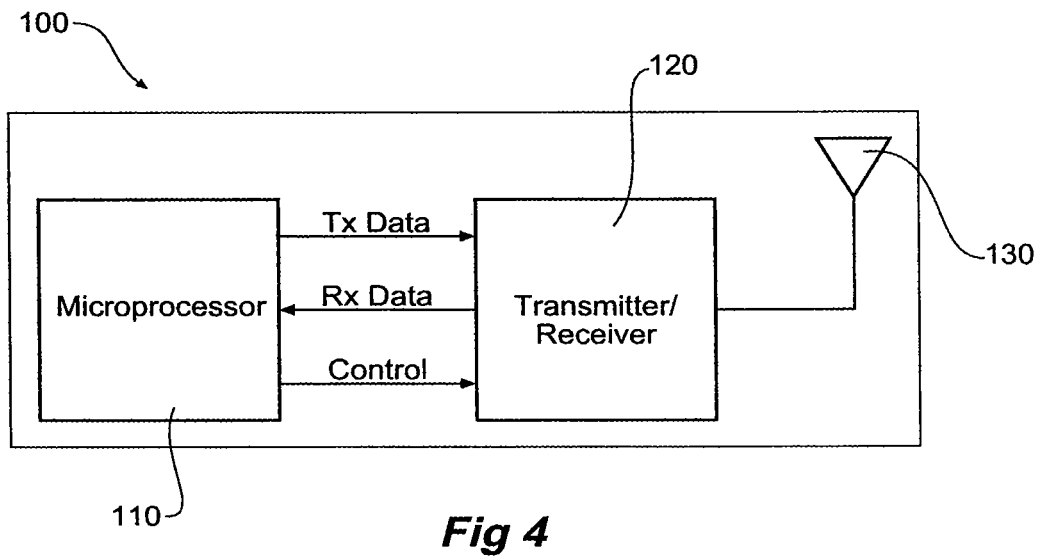
FIG. 4 shows a preferred structure of a transceiver device used on the present invention.

The preferred implementation of the transceiver device 100 uses a radio receiver, a radio transmitter, and a microprocessor. These first two items can optionally be combined as a transmitter/receiver 120, as shown in FIG. 4, which shows device 100 including microprocessor 10 and transmitter/receiver 120. Transmitter/receiver 120 transmits and receives data via antenna 130.

It will be appreciated that use of a microprocessor is not mandatory. For example the protocol could be implemented in a dedicated integrated circuit, a programmable logic device or a programmable gate array. Using a microprocessor is convenient because it allows a readily modifiable software implementation, and reduces the overall parts count. However the software implementation is only suitable for low to moderate data rates.

The function of the transmitter/receiver 120 is to receive or transmit information. The choice of transmitter/receiver will be determined by a range of factors, including (but not limited to):
a. The regulatory environment of the market into which the product will be sold.
   Each country has regulations that determine factors including allowable frequencies, transmit power levels and bandwidth.
   Transmitter/receivers suitable for use in some countries may be illegal in other countries.
   For products with a broad sales appeal in a range of countries, it is possible that several different transmitter/receivers will need to be selected, appropriate to each country.
b. Power consumption, in conjunction with any other considerations that determine the amount of power available.
   For example, transmitter/receivers with a high power consumption may be unsuitable for battery operation.
c. Time for the transmitter/receiver to switch between receive and transmit modes.
   In the communication protocol of the present invention, the time to switch between receive and transmit is important, because the protocol includes a set of fixed time slots. Depending on the overall transaction being performed, a time slot may need to be received or transmitted.
   The time to switching between receive and transmit constitutes an overhead (dead time). Large switching times have the effect of wasting bandwidth.
d. Interface type.
   Many types of transmitter/receiver are available. A type that provides digital data input and output gives the simplest interface with the microprocessor.
e. Data rate.
   The transmitter/receiver needs to support a data rate appropriate to the overall product requirements. This data rate could be anywhere between extremely low or extremely high.
f. Physical size, and the amount of space available.
g. Cost.
h. Amount of design effort.

At the very least, the transmitter/receiver needs:
a. A Transmit data input, used by the microprocessor to place a communication state onto the wireless medium;
b. A Receive data output, used by the transmitter/receiver to indicate to the microprocessor the state of the wireless medium; and
c. A control input, used by the microprocessor to select a receive or transmit mode of operation of the transmitter/receiver.

Control inputs can range between very simple, and very complex. At the simplest extreme, it is used to select between receive and transmit. Some transmitter/receivers support a low power "sleep" mode. Others allow complex setup and configuration to be made for transmitter/receiver operating behaviour.

For the protocol described, the type of control input is not critical.

Some suitable transmitter/receivers include RFM ASH series TR1000 to TR3100, Chipcon CC1000 and Nordic NRF401, NRF403.

The microprocessor 110 is used to implement the communication protocol, using the transmitter/receiver as the means of placing communication states onto the wireless medium, and receiving communication states from the wireless medium.

The type and choice of microprocessor is not very critical, provided that it can perform operations with precise timing. The degree of precision only needs to be enough to avoid creating bit errors in the communication protocol.

The protocol is best implemented in a bit-oriented manner, because this allows the point at which the time slots begin to be easily recognised.

The microprocessor is responsible for implementing at least some of the following functions:
a. A data encoding and decoding scheme used for transmission and reception—for example, Manchester coding;
b. Recovery in the receiver of the transmitted clock—for example by synchronising onto a preamble;
c. Detection of collisions;
d. Creation of each time slot, and appropriate transmission or reception during the time slot to exchange the relevant acknowledge information;
e. Implementation of an error detection scheme that can be used by a receiving device to determine if a transmission is received with or without error; and
f. Implementation of an error correction scheme that can be used by a receiving device to correct for some number of received errors during a transmission.

Figure 5:
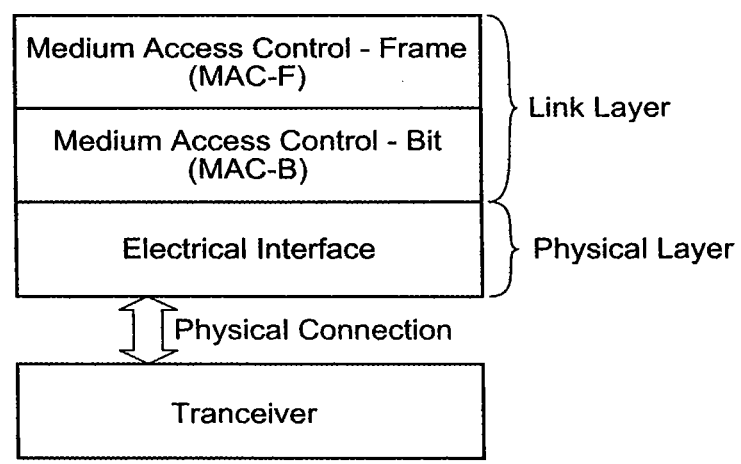
FIG. 5 shows parts of the ISO 7 layer model in which certain functions of the transceiver device of FIG. 4 are performed.

As previously described, a common method for describing the functions used in communication protocols is the ISO 7 layer model. Whilst a software structure based on this model is not mandatory, its use simplifies the overall design. Using this model, the functions performed in the bottom few layers are shown in FIG. 5.

The microprocessor hardware provides the electrical interface (Physical layer).

The microprocessor software performs the functions of all higher layers.

In particular, the software MAC-B portion of the Link Layer is responsible for all time—critical functions of data transmission and reception, including at least some of the following:
a. Starting a new transmission (including generation of any preamble);
b. Transmitting data bits;
c. Transmitting frame markers;
d. Starting reception;
e. Synchronisation onto the transmitted data stream and clock recovery;
f. Reception and decoding of data bits;
g. Reception and decoding of frame markers;
h. Notification of a collision;

i. Starting each time slot; and j. Transmission or reception of data bits inside a time slot.

The software MAC-F portion of the Link Layer is not so time critical. It is responsible for higher level message-oriented processing, including at least some of:
- a. Construction of a packet from received data bits;
- b. Packet error checking;
- c. Determination of when to acknowledge, and the type of acknowledgement to be generated (using the time slot services of MAC-B);
- d. Based on packet structure, scheduling and operation of a repeated transmission;
- e. Starting the transmission of a new packet;
- f. Generation of packet error-check sequences;
- g. Transmission of a packet, bit at a time;
- h. Examination of acknowledgements, and collisions, and determination of whether a packet should be re-transmitted and when that re-transmission should occur.

Many different microprocessors are available. Some have special hardware functions available which remove some of the processor load for time critical functions, such as generation of time intervals, generation of pulses, and so on. Whilst these hardware functions are not mandatory, their use greatly simplifies the software design and coding. Some microprocessors that are suitable for use in this invention include the Texas Instruments MSP430 family, Atmel Atmega family and the Hitachi H8/3644 family.

As previously mentioned, and according to a further aspect of the present invention, special markers are used in the Transaction to show the beginning and end of the variable-length data portion in the Transaction frame.

In the protocol of the present invention, it is important to fix in time the end of the variable portion, because this forms a reference point that defines when the fixed time slots can begin (for acknowledge transmissions). According to this aspect of the invention, use is made of the concept of encoding data to provide "states".

It is desirable for communication media to require some form of balanced transmission to avoid accumulation of a dc offset. This balance requires that the number of ON and OFF states on the medium be equal, when considered over a moderate to long time period.

There are a number of encoding schemes that can be used to translate the data bits into states on the medium. These vary in terms of the bandwidth they consume on the medium, and the ease of recovery of the transmitted data in a receiver.

One of the most common is Manchester coding. This coding uses two states on the medium for each data bit, and has a simple process for data recovery in the receiver. This codes a 1 bit as the state pair (OFF, ON), and a 0 bit as the state pair (ON, OFF).

The Manchester code always has a state transition (OFF to ON, or ON to OFF) in the middle of each data bit which greatly simplifies the process in the receiver of data recovery and synchronisation onto the transmitter clock.

In the Manchester code, the state pairs (OFF, OFF and ON, ON) are not permitted.

The Manchester code can be exploited, so that the illegal state pairs are used to convey information about points of significance.

The exact choice of the illegal state sequence is not very important, so long as it is used consistently. Preferably, the dc balance of the Manchester coding should be preserved.

A suitable coding to represent the end of the variable portion of the transmission is to use a simple illegal sequence: (ON, ON, OFF, OFF). This preserves the dc balance, and can be easily recognised by the Manchester decoder.

If additional information needs to be conveyed, this sequence can be used as a "lead-in". So, for example, other possible sequences might be:

(ON, ON, OFF, OFF, ON, OFF)=first point of significance
(ON, ON, OFF, OFF, OFF, ON)=second point of significance When the methods and advantages are considered together, the preferred protocol implementation is bit-oriented, synchronous, and exploits illegal coding to denote points of significance in the variable part.

This has the advantage of providing a high level of time-based precision in finding the end of the variable portion, is relatively easy to implement, removes any reliance on characterisation of UARTs, and does not need escape sequences or bit-stuffing. Furthermore, the high time-based precision in finding the end of the variable portion also creates a high level of precision in determining the start of the fixed time slots that follow. An example of the use of a start marker (12) and an End Marker (13) is shown in FIG. 3

The fixed time slots are easily transmitted, simply by counting the transmitted states or bits. The received time slots require a Manchester decoder (without the need to support the illegal states), and a timer in the case where nothing is transmitted during the period of the received time slot.

It will be understood that the above has been described with reference to a preferred embodiment and that many variations and modifications may be made within the scope of the present invention.

What is claimed is:

1. A method of providing a reference marker within a data time frame for transmission by a transmitter in a wireless communication system to one or more receivers, the data time frame including at least one variable length time slot followed by a fixed length time slot, and the reference marker is located at the end of a variable length time slot in the data time frame and before the start of the fixed length time slot in the data time frame to act as a reference point indicating the end of the variable time slot within the data time frame, the method including:
   encoding data bits within a data sequence to provide states for transmission in the data time frame;
   generating a state combination that is an illegal combination at the end of the variable length time slot in the data time frame; and
   recognizing the illegal combination as the reference marker in the data time frame indicating the end of the variable length time slot in the data time frame and the start of the fixed length time slot in the data time frame.

2. A method according to claim 1 wherein the encoding used is Manchester coding.

3. A method according to claim 1 wherein a dc balance in the transmission is preserved.

4. A method according to claim 2 wherein the illegal combination commences with a state pair of OFF, OFF, or ON, ON.

* * * * *